(12) United States Patent
Bachrach et al.

(10) Patent No.: US 6,698,991 B1
(45) Date of Patent: Mar. 2, 2004

(54) FABRICATION SYSTEM WITH EXTENSIBLE EQUIPMENT SETS

(75) Inventors: Robert Z. Bachrach, Burlingame, CA (US); John C. Moran, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/517,227

(22) Filed: Mar. 2, 2000

(51) Int. Cl.⁷ .............................................. B65G 49/07
(52) U.S. Cl. ...................... 414/217; 414/939; 414/940
(58) Field of Search ................. 414/217, 939, 414/940

(56) References Cited

U.S. PATENT DOCUMENTS

| | | | |
|---|---|---|---|
| 5,980,183 A | | 11/1999 | Fosnight |
| 6,012,235 A | * | 1/2000 | Kato et al. ..................... 34/406 |
| 6,026,561 A | * | 2/2000 | Lafond ......................... 29/722 |
| 6,087,811 A | * | 7/2000 | Watanabe et al. ............. 414/269 |
| 6,134,482 A | * | 10/2000 | Iwasaki ........................ 700/121 |
| 6,169,935 B1 | * | 1/2001 | Iwasaki et al. ............... 700/214 |
| 6,253,117 B1 | * | 6/2001 | Soraoka et al. ............. 700/214 |
| 6,468,021 B1 | * | 10/2002 | Bonora et al. ............... 414/522 |

* cited by examiner

Primary Examiner—Steven A. Bratlie
(74) Attorney, Agent, or Firm—Dugan & Dugan

(57) ABSTRACT

A fabrication system is provided which includes a storage apparatus coupled perpendicularly to a branch transport aisle, and one or more environmentally controlled fabrication tools coupled parallel to the branch transport aisle. The fabrication tools can encompass single chamber units or larger cluster tools with sub mainframes. The storage apparatus has one or more load ports which allow transfer of wafer carriers to or from a factory transport agent. A tool loading platform is positioned to receive a wafer carrier from the storage apparatus and to enable the fabrication tool to access a wafer carrier positioned thereon. A plurality of fabrication tools may be coupled beside each other within the equipment set. Each of the plurality of fabrication tools is coupled to the storage apparatus so that a wafer or wafer carrier may be received from or transferred to a factory transport agent and may travel along the storage apparatus to any of the plurality of fabrication tools coupled thereto. A computer program allows input of the number of tools coupled to a storage apparatus, and adjusts wafer carrier delivery based thereon. A method of reducing initial capital investment is also provided.

18 Claims, 6 Drawing Sheets

FABRICATION SYSTEM WITH EXTENSIBLE EQUIPMENT SETS

FIELD OF THE INVENTION

The present invention relates generally to fabrication systems, and more particularly to fabrication systems for manufacturing substrates within environmentally controlled fabrication tools.

BACKGROUND OF THE INVENTION

In the semiconductor integrated circuit fabrication industry, a single defect can destroy an entire wafer die by disrupting features essential to the semiconductor devices formed therein. Defects also can degrade device performance and reliability by creating leakage paths, generating undesirable localized fields, and the like.

A defect can arise when a particle lands on a wafer. Particles commonly arise from humans, the environment in which the wafer is processed (e.g., particles generated by friction between moving objects within the processing chamber), as well as from films deposited or grown on the wafer.

To reduce particle-induced defects, wafers are fabricated in a clean environment, and are mass produced in a large enclosed clean area known as a FAB, which contains a plurality of processing tools that are often roughly arranged along a grid to make transport efficient. A grid layout facilitates wafer transport organization, and enables automated wafer transport. Currently, within a grid layout processing chambers and tools which supply wafers thereto are treated as a production unit and FAB control software treats each such production unit as an independent entity.

Two primary grid layouts are 1) a bay and chase layout, and 2) a ballroom layout, each of which is shown in FIGS. 1A and 1B respectively.

FIG. 1A shows a bay and chase layout 11a comprising a clean transport aisle 13 which branches into a plurality of branch transport aisles 15. A clean room wall 17 defines the clean transport aisle 13 and the branch transport aisles 15. When defined by a clean room wall 17 the branch transport aisles are known as bays.

Behind the wall is an area known as a chase 19 which contains a plurality of processing tools 21. Each of the processing tools 21 has a load port positioned adjacent an opening in the clean room wall 17 so that wafer carriers may be transported along the clean transport aisle 13, into a bay 15, and through the clean room wall 17 into a processing tool 21.

FIG. 1B shows a ballroom layout 11b. The ballroom layout 11b is identical to the bay and chase layout 11a of FIG. 1 except the clean room wall 17 is omitted. In this case, more of the support facilities are on the floor underneath the processing tools 21.

In either the layout of FIGS. 1A or 1B, the processing tools 21 may comprise an environmentally sealed semiconductor device fabrication tool (hereinafter a "fabrication tool"). A fabrication tool typically includes at least one load port which receives a wafer carrier housing one or more wafers and which places the wafer carrier into the tool's environment; at least one processing chamber for performing processing on wafers extracted from the wafer carrier, and possibly one transfer chamber containing a wafer handler adapted to transfer wafers between the load lock and the processing chamber.

Further, in either the layout of FIGS. 1A or 1B, the FAB 11a, 11b can be maintained as a clean room, having filters and/or other mechanisms for removing particles from the environment. Such a clean room is monitored to ensure that the level of particles per cubic foot of clean room does not exceed a predetermined level or clean room "class". However, due to the amount of filtering required, it is extremely expensive to achieve the highly clean environment required of an area in which a wafer or wafer carrier is exposed to the environment outside the fabrication tool. Typically a class 1 environment having fewer than about 7,000 particles of 0.5 micron size or larger per cubic foot is required of such areas. Thus many FABs use sealed wafer carriers that enclose the wafers in a clean, mini-environment during transport allowing the cleanliness level of the FAB as a whole to be reduced.

Generally, within a bay and chase layout 11a, because a fabrication tool maintains wafers and wafer carriers in a controlled environment after they are loaded into the load lock and the desired environment is achieved, the clean room wall 17 divides the clean room into two areas, a white area having a high cleanliness level as wafers may be exposed to the environment while in those areas (e.g., in the bay 15 and/or the clean transport aisle 13) and a gray area having a lower cleanliness level than the white area as wafers may be sealed within a wafer carrier or within a fabrication tool 21 while in those areas (e.g., the chase 19). Because wafers and/or wafer carriers are exposed to the environment adjacent the load lock, the load lock of a fabrication tool is positioned with a sealable opening thereof (e.g., a slit valve or a door) extending through the clean room wall 17 such that the area adjacent the load lock's opening is maintained as a white environment. The remainder of the fabrication tool 21 is maintained within the gray environment of the chase 19, typically a class 100 environment having fewer than about 700,000 particles of 0.5 micron size or larger per cubic foot.

The bay and chase layout (FIG. 1A) is intended to reduce clean room costs by allowing for a gray area where less filtering is required. However, the clean room wall 17 and the differing clean room gowning (e.g., special clothing) requirements between the gray area and the white area hinders access to the fabrication tool. In contrast, the ballroom layout (FIG. 1B) allows free access to the area surrounding the fabrication tool. A ballroom FAB is maintained at a less expensive cleanliness level, intermediate the white and gray areas. However, wafers must be transported in sealed carriers or "pods". In both the ballroom and the bay and chase layouts, the addition of processing tools 21 requires elongation of the branch transport aisle 15 (or the addition of more aisles) and increases the complexity of managing the FAB due to the dispersal of like equipment and due to the increased complexity of the software program that controls wafer transport within the FAB 11a, 11b (because, as described further below, additional tool loading platform locations must be included in the program). Regardless of the layout employed, construction of a FAB remains costly due to both clean room costs and the significant capital investment required to provide a fault tolerant system (i.e., a system having a sufficient number of tools to maintain a desired production rate (wafers/hour), despite the inevitable tool downtime required for tool repair and maintenance ).

Accordingly, there is a need for a fabrication system design that facilitates a gradual or staged increase in fabrication tool numbers, and that minimizes the white area of the clean room. Further, improved business methods are required to reduce initial equipment costs while maintaining a fault tolerant FAB.

SUMMARY OF THE INVENTION

The present invention provides a FAB configuration which locally organizes production units or processing tools such that production capacity can be independently adjusted for each process step. Accordingly, process capacity can be added without requiring branch transport aisle elongation, and without requiring the programming of additional tool load ports into the program that controls the FAB. The inventive FAB configuration, referred to herein as a SuperFrame, arranges tools in sets. Each tool in a tool set is coupled to the branch transport aisle via a common storage-movement apparatus which is positioned perpendicular to the branch transport aisle. The common storage-movement apparatus has one or more factory load ports adapted to receive wafer carriers from the branch transport aisle. Similarly, the tool set and the storage-movement apparatus has one local control program that supervises the tool set and the storage-movement apparatus and presents the tool set and the storage-movement apparatus to the FAB as one unit.

Additionally a method of reducing capital equipment costs without reducing fault tolerance is provided. Specifically, an additional processing tool, not needed for steady state processing, is provided in exchange for periodic (e.g., monthly or quarterly) payment. Alternatively, payment may be conditioned on future use. Thus, a manufacturer has an additional tool which provides backup capability or fault tolerance, yet does not have the initial capital investment cost of purchasing the additional tool.

Other features and advantages of the present invention will become more fully apparent from the following detailed description of the preferred embodiments, the appended claims, and the accompanying drawings.

DETAILED DESCRIPTION OF THE PREFERRED EMBODIMENTS

In order to appreciate the advantages of the present invention, it is important to understand the complexity and the capital investment issues presented by conventional fabrication systems. Namely, conventional FABS start from individual tools, while a SuperFrame fabricated in accordance with the present invention provides an additional level of process aggregation.

Figure 1A:
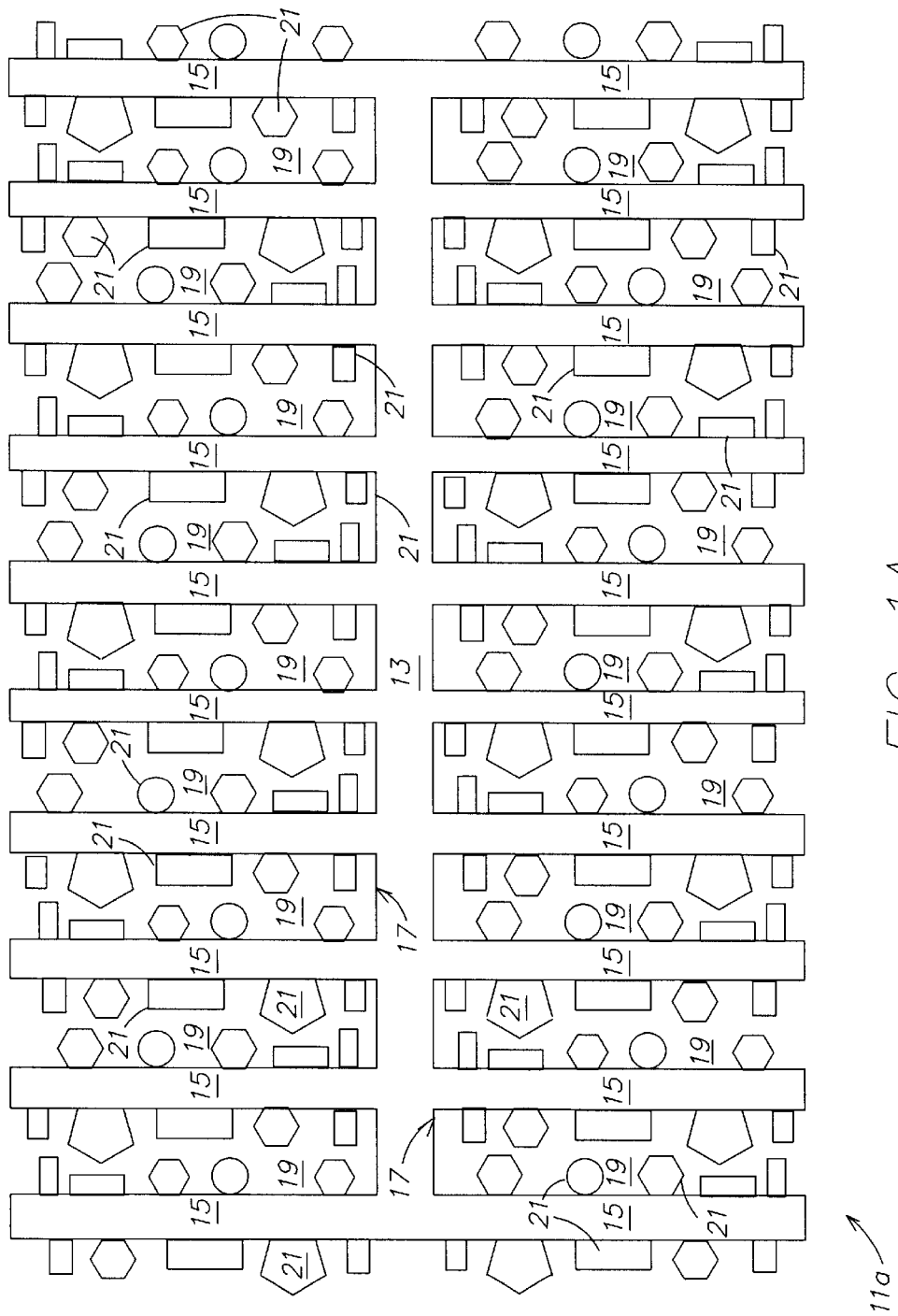
FIG. 1A is a schematic top plan view of a bay and chase layout comprising a clean transport aisle which branches into a plurality of branch transport aisles.
Figure 1B:
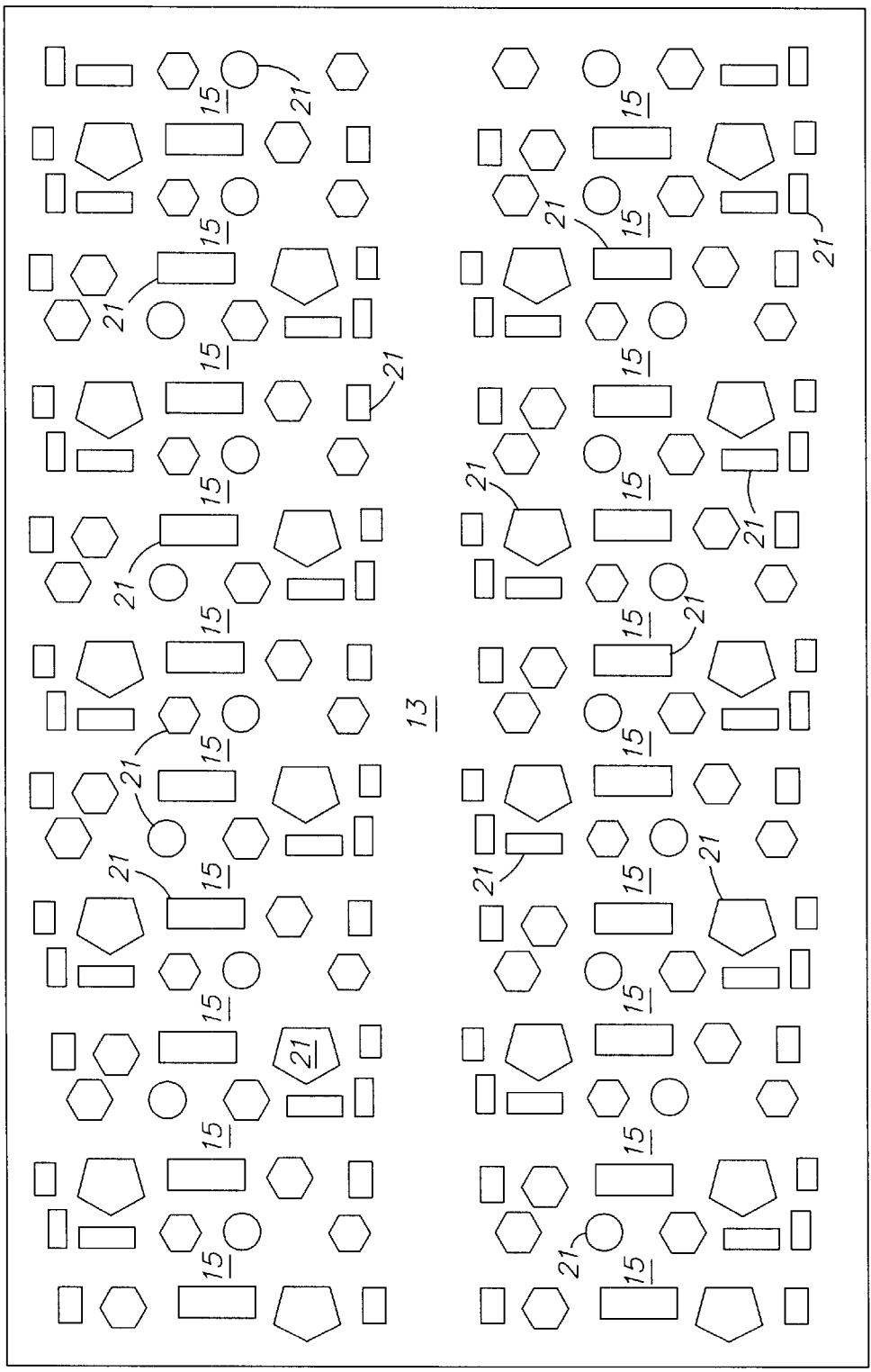
FIG. 1B is a schematic top plan view of a ballroom layout.
Figure 2:
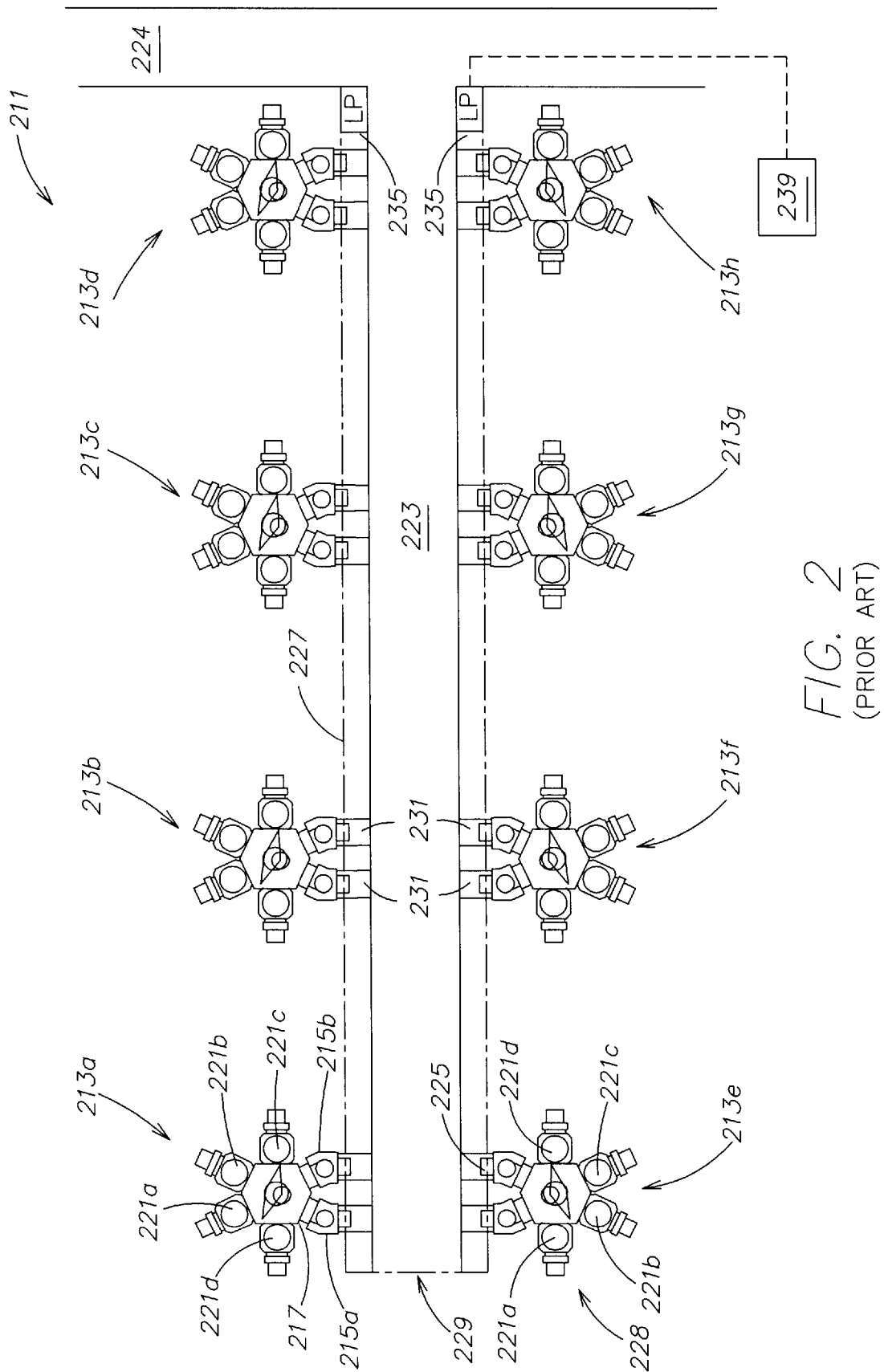
FIG. 2 is a schematic top plan view, in pertinent part, of a conventional fabrication system, employing a plurality of processing tools;.

A conventional fabrication system is described with reference to FIG. 2. FIG. 2 is a schematic top plan view, in pertinent part, of a conventional FAB 211, employing a plurality of processing tools 213a–h. The processing tools 213a–h represent any conventional processing tool such as the Endura™ or Centura™ both of which are manufactured by Applied Materials, Inc. of Santa Clara, Calif. Both the Endura and the Centura are examples of vacuum processing tools, a particular kind of environmentally controlled processing tool. Generally, such processing tools employ one or more load locks 215a–b, coupled to a transfer chamber 217 which contains a wafer handler 219, and a plurality of processing chambers 221a–d. Each of the vacuum processing tools 213a–d is positioned along a branch transport aisle 223 which branches from a clean transport aisle 224. A clean room wall 227 (shown in phantom) may be employed. When a clean room wall 227 is employed, at least the area surrounding the slit valves 225 of the load locks 215a–b extends through the clean room wall 227 which separates a gray area 228 from a white area 229, as shown.

A tool loading platform 231 is adapted to receive a wafer carrier from a factory transport agent, (e.g., an overhead conveyor, an automatic guided vehicle, etc.), or from a storage mechanism 235 positioned adjacent each tool 213a–h. The wafer carrier may be placed directly on the tool loading platform 231 by the factory transport agent, or by the storage mechanism 235, or may be transferred from the factory transport agent to the tool loading platform 231 by a tool loader robot (not shown). The loading platform 231 may comprise a mechanism for opening sealed cassettes or "pods" of wafers. An exemplary pod opening mechanism is described in U.S. Pat. No. 5,772,386, which is incorporated herein in its entirety by this reference. A storage mechanism 235 such as that described in U.S. patent application Ser. No. 09/350,867, or U.S. Pat. No. 5,980,183, (incorporated herein in their entirety by this reference) is typically employed to store cassettes in the vicinity of each tool 213a–d.

To create a fault tolerant system a first set of identical tools (e.g., tools 213a and 213b) perform a first process, or series of processes, and a second set of identical tools (e.g., tools 213c and 213d) perform a second process or series of processes, and each tool within a set is operated at less than full capacity (e.g., 50–75% capacity). Thus, if one tool in a set becomes inoperable, other tools in the set can increase their production rate in order to maintain the FAB's desired wafer per hour rate.

A controller 239 containing a manufacturing execution and material control (MEMC) program controls the scheduling of the independent tools, the operation of the factory transport agent, the storage mechanism 235, the tool loader robot (if any) etc. Accordingly, for tool sets containing two identical tools, when the MEMC program 239 receives input indicating a first fabrication tool (e.g., tool 213a) in a tool set is inoperable, the MEMC program 239 routes cassettes to the second fabrication tool (e.g., tool 213b) in the set. Alternatively, each storage and movement apparatus and the tools coupled thereto may be controlled by a separate, local controller which allows the MEMC program to view the storage and movement apparatus and the tools coupled thereto as a single unit (e.g., allowing the MEMC program to store only information regarding the storage and movement apparatus' load port, information regarding the tool sets capacity).

In operation, under the control of the MEMC program 239, a wafer carrier is transported along the central transport aisle 224 (e.g., manually, via an overhead transfer mechanism (OHT), an automatic guided vehicle (AGV), etc.) and is transferred therefrom to a load port LP of the storage mechanism 235. Thereafter, the wafer carrier may be transferred along the storage mechanism 235 either directly to one of the tool loading platforms 231 or to a position where a tool loader robot (not employed in the configuration of FIG. 2) can extract the wafer carrier from the storage mechanism 235 and place the wafer carrier on the respective tool loading platform 231. One or more wafers are then loaded from the tool loader platform 231 into the respective load lock 215a–b. If one of the processing tools (e.g., tool 213a) is inoperable, the MEMC program 239 receives input (either manually or from the controller of the inoperable processing tool) indicating the processing tool's inoperability. The MEMC program 239 directs wafer carriers to other processing tool(s) in the set (e.g., tool 213b).

Because FABs are capital intensive, great effort goes into minimizing the amount of equipment and clean room space required, and adding capacity in as small increments as possible, consistent with productivity requirements. FAB capacity must be carefully managed, as having too little capacity during sales-up-turns is just as bad as having too much capacity during sales down-turns.

Each incremental addition to the FAB typically requires reorganization of existing equipment so as to optimize process flow and system footprint, and often requires elongation of the branch transport aisle 223 or use of another aisle. Further, if existing equipment requires re-organization, considerable revision to the MEMC program 239 is required (e.g., the MEMC program would require new tool loading platform locations 231 and new cassette routing paths).

The present invention addresses the short comings of prior art FABs by providing a FAB configuration which minimizes or reduces branch transport aisle length, and often requires no elongation of the branch transport aisle 223 as the FAB's capacity expands. Further, the inventive FAB requires no additional tool loading platforms 231 along the branch transport aisle 223 and therefore requires minimal revision to the MEMC program 239, as will be understood with reference to FIG. 3.

Figure 3:
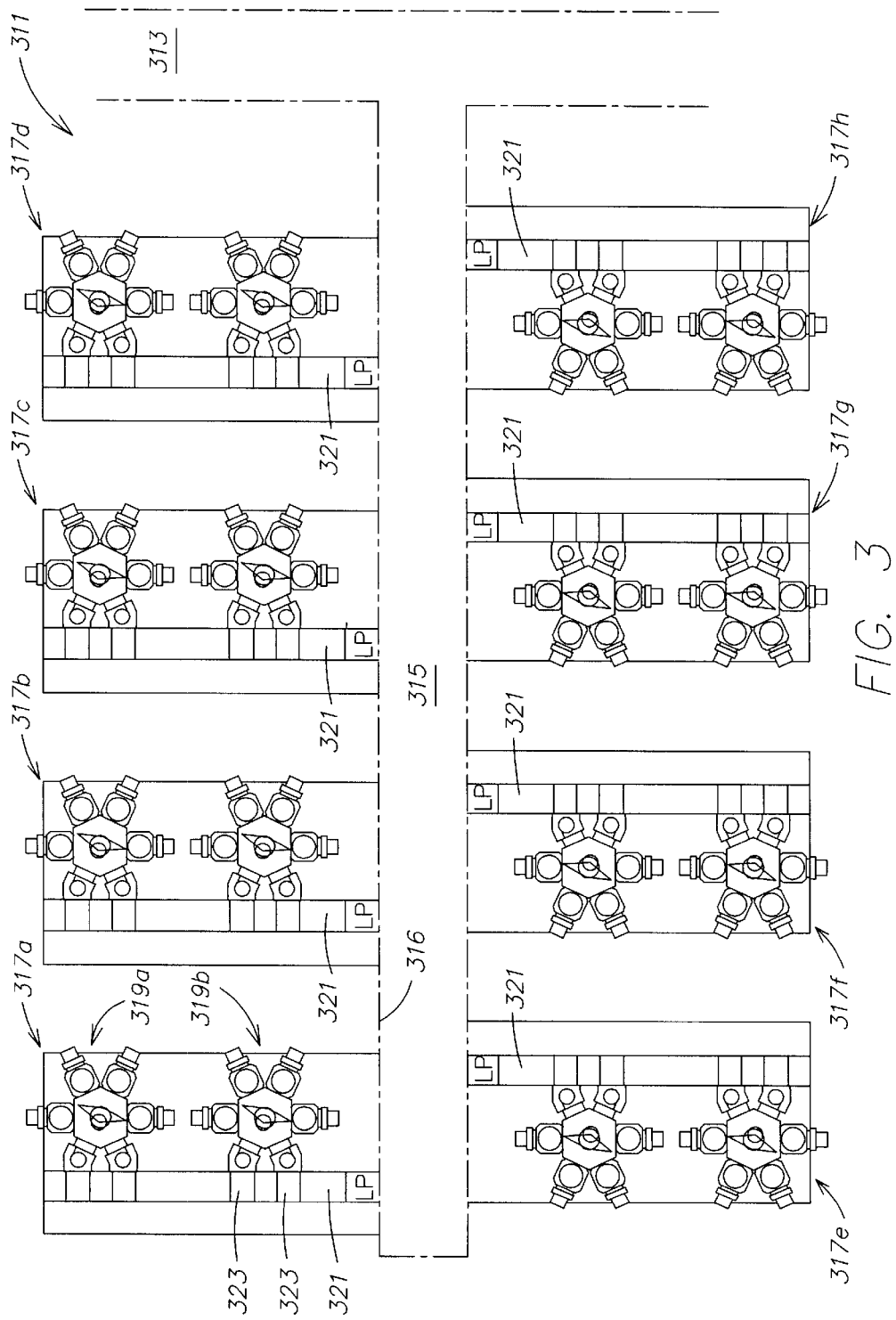
FIG. 3 is a top plan view, in pertinent part, of an inventive fabrication system.

FIG. 3 is a top plan view, in pertinent part, of an inventive fabrication system 311. The inventive FAB 311 comprises a central transport aisle 313 and a plurality of branch transport aisles 315 (only one shown). The central transport aisle 313 and the branch transport aisles 315 optionally may be defined by a clean room wall 316 as shown in phantom. A plurality of processing tool sets 317a–h, each containing two or more processing tools 319a–b are positioned along the length of each branch transport aisle 315. A storage apparatus 321 couples each tool set 317a–h to the branch transport aisle 315. Specifically, each storage apparatus 321 is perpendicular to the branch transport aisle 315 and has one or more load ports LP adapted to receive a wafer carrier from a factory transport agent (e.g., an overhead conveyor, an automatic guided vehicles, FAB personnel, etc.) or from a storage apparatus that runs parallel to the branch transport aisle as does the storage apparatus of FIG. 2. Each storage apparatus 321 comprises at least a horizontal transfer mechanism which extends in front of each of the processing tools 319a–h. Most preferably the storage apparatus 321 comprises a load buffer as shown and described below with reference to FIGS. 4A and 4B.

Each processing tool 319a–b has one or more tool loading platforms 323 coupled thereto, such that one or more wafer carriers may be transferred from the tool loading platform 323 to the respective processing tool 319, as is known in the art. Preferably the tool loading platform 323 comprises pod opening capability (i.e., the ability to open a sealed wafer carrier). Most preferably the tool loading platform 323 is configured as described in U.S. patent application Ser. No. 09/012,323, filed on Jan. 23, 1998 (AMAT No. 2569/ATD/MBE), which is incorporated herein by this reference.

The storage apparatus 321 preferably comprises a vertical transfer mechanism (such as an elevator or a pick and place robot) and a horizontal transfer mechanism (such as a conveyor or a shelf coupled to a pick and place robot) as described in detail in U.S. patent application Ser. No. 09/350,867. The storage apparatus 321 most preferably comprises a conveyor adapted to transfer a wafer carrier between processing tools 319, as described in U.S. patent application Ser. No. 09/350,867, and as shown and described with reference to FIGS. 4A and 4B.

Figure 4A:
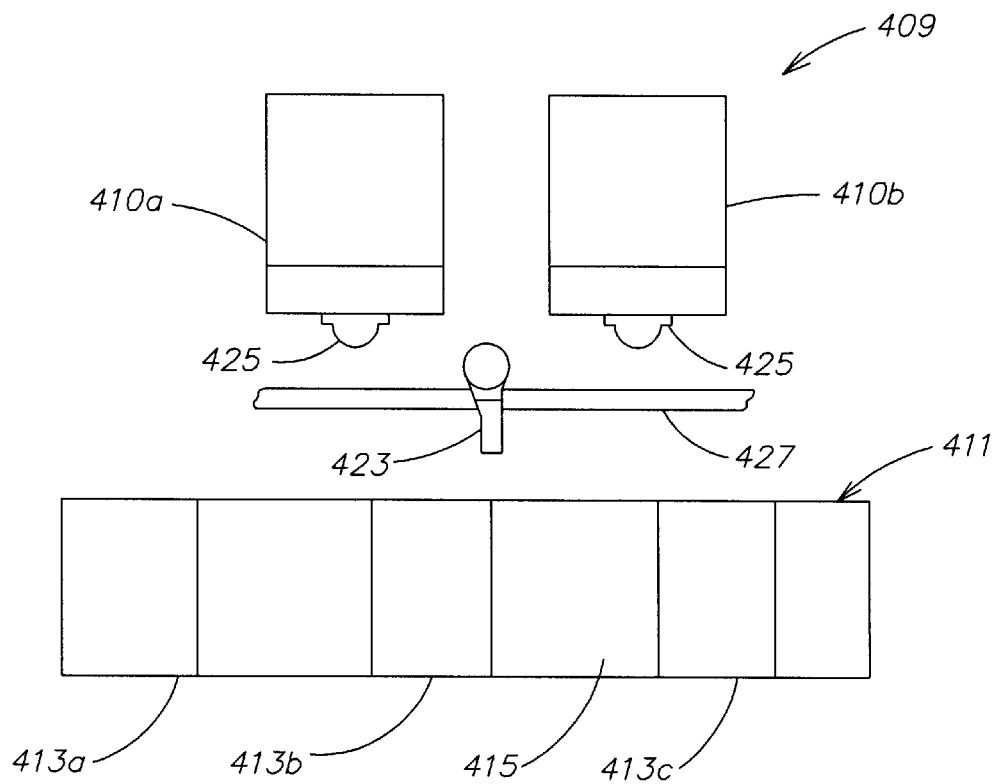
FIGS. 4A and 4B are a top plan view and a side elevational view, respectively, showing a configuration wherein a tool loader robot is adapted to transfer wafer carriers between a storage apparatus and a tool loading platform of one or more processing tools.
Figure 4B:
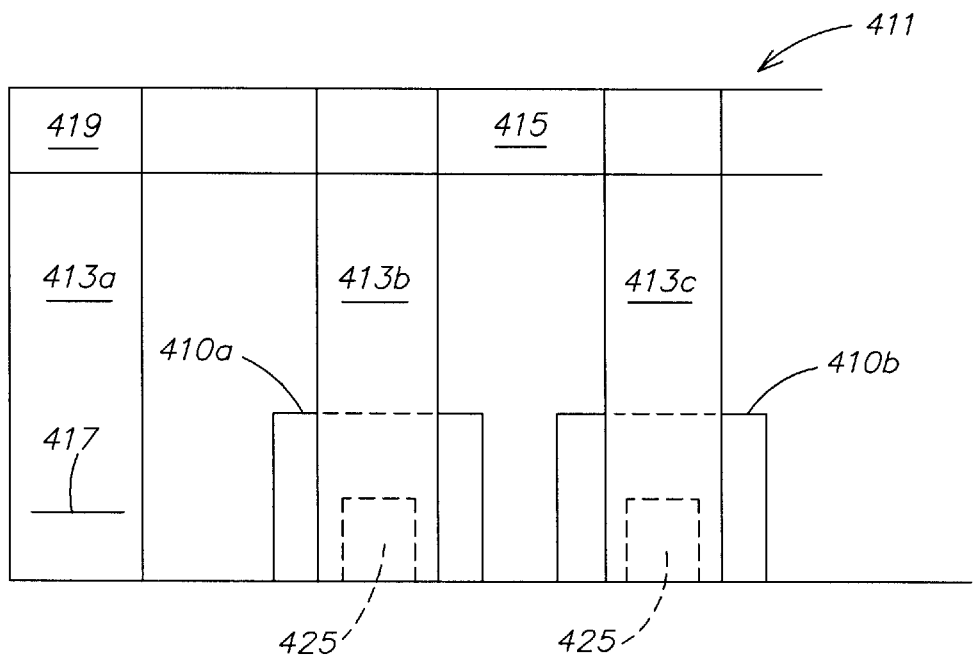

FIGS. 4A and 4B are a top plan and a side elevational view, respectively, of a processing tool set 409 (comprising a pair of processing tools 410a–b) having a preferred storage apparatus 411 coupled thereto. The storage apparatus 411 comprises three vertical transfer mechanisms (e.g., elevators) 413a–c, each of which couples to a single horizontal transfer mechanism 415 (e.g., a conveyor). The number of vertical transfer mechanisms required varies from one FAB configuration to the next, depending on the number of tools in the set. The first vertical transfer mechanism 413a is positioned closest to the branch transport aisle 315 (FIG. 3) and preferably has an E15 load port 417 (configured in accordance with SEMI standard E15) and an overhead load port 419 adapted to receive wafer carriers from manual or automatic transfer mechanisms, as is known in the art. Preferably each load port 417, 419 comprises a surface having a plurality of rolling elements. The surface may be lifted and lowered between the E15 load port 417 and the horizontal transfer mechanism. Preferably the horizontal transfer mechanism also comprises a plurality of rolling elements. Once a load port is in line with the horizontal transfer mechanism the rolling elements of the load port may be energized causing a wafer carrier positioned thereon to roll from the vertical transfer mechanism 413a onto the horizontal transfer mechanism 415.

Preferably the horizontal transfer mechanism 415 comprises a plurality of dual compartment segments of rolling elements that are indexable between a transfer position and a storage position as described in U.S. patent application Ser. No. 09/350,867. A wafer carrier may therefore be placed in storage or transferred across the horizontal transfer mechanism 415 to another one of the vertical transfer mechanisms 413b–c, which preferably comprises a surface of rolling elements that is in an elevated position adjacent the horizontal transfer mechanism 415. Thereafter the vertical transfer mechanism 413b–c lowers the surface of rolling elements, and the wafer carrier positioned thereon, to a position adjacent the respective processing tool 410a–b.

In the embodiment of FIG. 4A a tool loader robot 423 is adapted to transfer wafer carriers between the storage apparatus 411 and a tool loading platform 425 of one or more of the processing tools 410a–b. A single tool loader robot 423 may be coupled to a rail 427 which extends in front of a plurality of processing tools 410a–b or each processing tool 410a–b may have a tool loader robot 423 dedicated thereto.

Figure 5A:
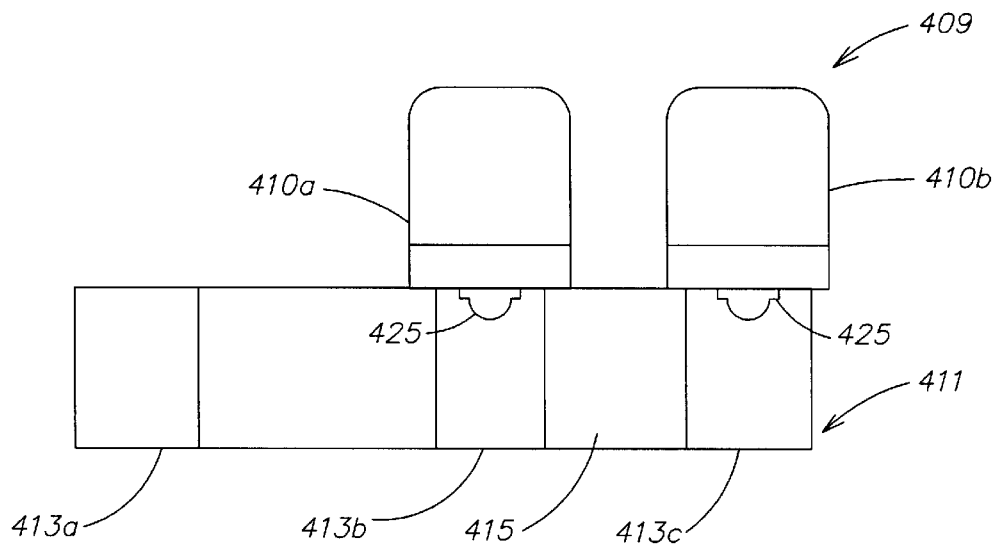
FIGS. 5A and 5B are a top plan view and a side elevational view, respectively, showing a configuration wherein the storage apparatus is adapted to deliver a wafer carrier directly onto a tool loading platform.
Figure 5B:
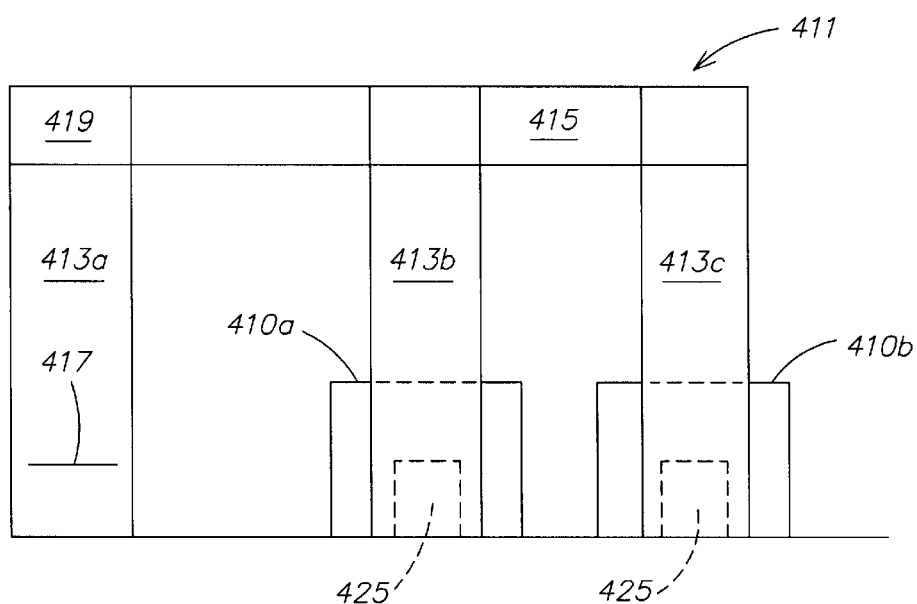

Alternatively, as shown in the top plan and side elevational views of FIGS. 5A and 5B, respectively, the tool loader robot 423 may be omitted and the storage apparatus 411 may deliver a wafer carrier directly onto the tool loading platform 425.

Once positioned on a tool loading platform 425 wafers or the wafer carrier may be transferred therefrom to the respective processing tool 410a–b for processing as is known in the art. If the wafer carrier is a sealed pod (e.g., a Standard Mechanical Interface (SMIF) pod), or a Front Opening Unified Pod (FOUP), the tool loading platform 425 comprises a mechanism for opening the same without exposing the wafers to the surrounding atmosphere, also as is known in the art.

After all the wafers in a wafer carrier have been processed within the first processing tool 410a they are returned to the tool loading platform 425 and, if applicable, sealed within a pod-type wafer carrier. The wafer carrier is then transferred to the vertical transfer mechanism 413a, elevated and either placed in storage or transferred along the horizontal transfer mechanism 415 to the second processing tool 410b (e.g., if the first and second processing tools 410a–b are adapted to perform sequential processes such as masking followed by etching) or to the E15 or overhead load ports 417, 419, respectively, where the wafer carrier is transferred to the branch transport aisle 315 (FIG. 3) for subsequent transfer to a second set of processing tools or for return to the central transport aisle 313 (FIG. 3) (e.g., for transfer to a second branch transport aisle).

As described above, the common storage-movement apparatus receives a wafer carrier from the FAB and can move the wafer carrier to a position in which the wafer carrier may be accessed by a processing tool (i.e., directly onto a tool loading platform, or onto a tool load port from which the tool's loader robot may pick up the wafer carrier for transfer either directly to the tool or to the tool loading platform). Each processing tool in a set may thus receive wafer carriers from the storage-movement apparatus, yet the FAB's control program contains information regarding only the factory load port(s) of the storage-movement apparatus and the information regarding capacity and processing necessary to schedule production.

Processing tools may be added to or subtracted from a tool set without requiring new factory load port information to be added to the FAB's control program. Only the tool set parameters which reflect the set's internal capabilities, processes to be performed, capacity, etc., need be added to the FAB's control program. Because each processing tool is generally parallel to the branch transport aisle, processing tools can be added without requiring additional branch transport aisle length, elongation of aisles or addition of new aisles. Significant cost savings may be realized both in reduced branch transport aisle lengths and in reduced downtime during addition of fabrication tools. Thus, production capacity may be increased with less downtime.

As is apparent from the above description, coupling a storage apparatus perpendicular to a branch transport aisle may-enable processing tools to be added to a branch transport aisle without requiring elongation of the branch transport aisle and without requiring additional load ports (e.g., the E15 load port 417 or the overhead load port 419). Accordingly, a FAB can be incrementally expanded with minimal downtime. To add a processing tool the horizontal transfer component of the storage apparatus is elongated so as to extend to a position adjacent the additional processing tool, and data is input to the MEMC program to reflect which set has been expanded, so that the flow of wafer carriers to and from the respective set can be increased accordingly.

To further facilitate incremental FAB expansion a method of reducing capital equipment costs without reducing fault tolerance is provided. Specifically, one or more additional processing tools (e.g., vacuum processing tools such as the Endura® or Centura® manufactured by Applied Materials, Inc. of Santa Clara, Calif.), that are not needed for steady state processing, are provided in exchange for periodic (e.g., monthly, weekly, yearly) payment. Alternatively payment may be conditioned on future use. Thus, a manufacturer has additional tool capacity which provides fault tolerance, yet does not have the initial capital investment cost of directly purchasing the additional processing tool(s). Further, this method allows the additional tool to be expensed rather than depreciated.

The foregoing description discloses only the preferred embodiments of the invention, modifications of the above disclosed apparatus and method which fall within the scope of the invention will be readily apparent to those of ordinary skill in the art. For instance, the present invention can be used in any grid type layout (e.g., bay and chase, ballroom, etc.), and depending on the space limitations may be used in a pinwheel or cartwheel layout as are known in the art. The invention can be used with or without the optional clean room wall 316 (shown in phantom in FIG. 3). The processing tools may be vacuum tools (e.g., adapted for physical vapor deposition, chemical vapor deposition, etch, etc.) or environmentally controlled non-vacuum tools, e.g., adapted for chemical mechanical polishing, cleaning, metrology, etc.) and may employ a single processing chamber or a plurality of processing chambers. The central transport aisle 313 and the branch transport aisles 315 may contain any configuration of wafer transport and/or storage equipment, e.g., a storage apparatus such as that shown in FIG. 3, or such as described in U.S. patent application Ser. No. 09/350, 867 may be positioned parallel to the branch transport aisle and adapted to supply wafer carriers to the storage apparatuses 321 positioned perpendicular to the branch transport aisle 315. Finally, as described in U.S. patent application Ser. No. 09/350,867, an incoming wafer carrier or lot may be divided into sublots and distributed to two or more processing tools in order to increase throughput.

Accordingly, while the present invention has been disclosed in connection with the preferred embodiments thereof, it should be understood that other embodiments may fall within the spirit and scope of the invention, as defined by the following claims.

The invention claimed is:

1. A fabrication system comprising:
   a branch transport aisle;
   a storage-movement apparatus adapted to store wafer carriers, the storage-movement apparatus being coupled perpendicular to the branch transport aisle, and having one or more load ports adapted to receive a wafer carrier from the branch transport aisle;
   a first fabrication tool coupled to the storage-movement apparatus; and
   a first tool loading platform adapted to receive a wafer carrier from the storage-movement apparatus, the first tool loading platform being positioned to enable the first fabrication tool to access a wafer carrier positioned thereon.

2. The system of claim 1 wherein the first fabrication tool is coupled perpendicular to the storage-movement apparatus so as to be oriented parallel to the branch transport aisle.

3. The system of claim 1 wherein the storage-movement apparatus comprises a vertical component adapted to move wafer carriers vertically and a horizontal component adapted to move wafer carriers horizontally.

4. The system of claim 1 wherein the storage-movement apparatus further comprises an overhead load port.

5. The system of claim 1 wherein the load port is an overhead load port.

6. The system of claim 3 wherein the load port is an overhead load port.

7. The system of claim 2 further comprising:
   a second fabrication tool coupled perpendicular to the storage-movement apparatus so as to be oriented parallel to the branch transport aisle; and
   a second tool loading platform adapted to receive a wafer carrier from the storage-movement apparatus, the second tool loading platform being positioned to enable the second fabrication tool to access a wafer carrier positioned thereon.

8. The system of claim 7 wherein the storage-movement apparatus comprises a vertical component adapted to move wafer carriers vertically and a horizontal component adapted to move wafer carriers horizontally.

9. The system of claim 7 wherein the storage-movement apparatus further comprises an overhead load port.

10. The system of claim 7 wherein the load port is an overhead load port.

11. The system of claim 8 wherein the load port is an overhead load port.

12. The system of claim 7 wherein the first and second fabrication tools are configured to perform identical processes.

13. The system of claim 7 wherein the first and second fabrication tools are configured to perform different processes.

14. The fabrication system of claim 1, further comprising a central transport aisle, and wherein the branch transport aisle is coupled to the central transport aisle.

15. The fabrication system of claim 14, wherein the branch transport aisle is coupled perpendicular to the central transport aisle.

16. A fabrication system comprising:
   a branch transport aisle; and
   a plurality of fabrication tool sets, each comprising:
      an apparatus adapted to store wafer carriers, the storage apparatus being coupled perpendicular to the branch transport aisle, and having one or more load ports adapted to receive a wafer carrier from a factory transport agent;
      a first fabrication tool coupled perpendicular to the storage apparatus so as to be oriented parallel to the branch transport aisle; and
      a tool loading platform adapted to receive a wafer carrier from the storage apparatus, the tool loading platform being positioned to enable the first fabrication tool to access a wafer carrier positioned thereon.

17. The fabrication system of claim 16, further comprising a central transport aisle, and wherein the branch transport aisle is coupled to the central transport aisle.

18. The fabrication system of claim 17, wherein branch transport aisle is coupled perpendicular to the central transport aisle.

* * * * *